United States Patent
Ohno et al.

(10) Patent No.: US 8,875,383 B2
(45) Date of Patent: Nov. 4, 2014

(54) COMPONENT SUPPLYING APPARATUS, COMPONENT MOUNTING APPARATUS, COMPONENT SUPPLYING METHOD, POSITIONING APPARATUS, AND POSITIONING METHOD

(75) Inventors: Katsuhiko Ohno, Kanagawa (JP); Koki Maekawa, Saitama (JP)

(73) Assignee: Juki Automation Systems Corporation, Tokyo (JP)

( * ) Notice: Subject to any disclaimer, the term of this patent is extended or adjusted under 35 U.S.C. 154(b) by 1188 days.

(21) Appl. No.: 12/783,259

(22) Filed: May 19, 2010

(65) Prior Publication Data
US 2010/0313407 A1 Dec. 16, 2010

(30) Foreign Application Priority Data
Jun. 12, 2009 (JP) .................. 2009-141212

(51) Int. Cl.
B23P 19/00 (2006.01)
B23Q 15/00 (2006.01)
H05K 13/04 (2006.01)

(52) U.S. Cl.
CPC ........ *H05K 13/0417* (2013.01); *H05K 13/0452* (2013.01)
USPC ............... 29/703; 29/701; 29/702; 29/740; 29/743; 29/822

(58) Field of Classification Search
USPC .......... 29/563, 701, 702, 703, 428, 822, 823, 29/740, 743
See application file for complete search history.

(56) References Cited

U.S. PATENT DOCUMENTS

| 5,305,518 A * | 4/1994 | Okumoto ................... 29/822 |
| 2008/0124842 A1* | 5/2008 | Wang et al. ................ 438/118 |
| 2010/0071204 A1* | 3/2010 | Yonemitsu et al. ......... 29/822 |

FOREIGN PATENT DOCUMENTS

| JP | 07-144815 | 6/1995 |
| JP | 2917826 | 4/1999 |
| JP | 2003-124686 | 4/2003 |
| JP | 2004-182293 | 7/2004 |
| JP | 2008-078413 | * 4/2008 ............. H05K 13/02 |

OTHER PUBLICATIONS

Japanese Office Action issued in connection with related Japanese patent application No. 2009-141212 dated Feb. 5, 2013.

* cited by examiner

*Primary Examiner* — Peter DungBa Vo
*Assistant Examiner* — Jeffrey T Carley
(74) *Attorney, Agent, or Firm* — Dentons US LLP

(57) ABSTRACT

A component supplying apparatus includes a motor, a rotating body, a transmitting mechanism, and a predicting section. The rotating body engages with a carrier tape in which a plurality of components to be mounted on a circuit board by a component mounting apparatus are accommodated at predetermined pitches and pays out the carrier tape at the predetermined pitches for supplying the plurality of components. The transmitting mechanism transmits a driving force of the motor to the rotating body. The predicting section predicts a deviation amount of a supplying position of each of the plurality of components based on a model formula expressing a periodical fluctuation of the supplying position of each of the plurality of components that is due to the transmitting mechanism and caused at a time the carrier tape is paid out by the rotating body.

5 Claims, 15 Drawing Sheets

COMPONENT SUPPLYING APPARATUS, COMPONENT MOUNTING APPARATUS, COMPONENT SUPPLYING METHOD, POSITIONING APPARATUS, AND POSITIONING METHOD

BACKGROUND OF THE INVENTION

1. Field of the Invention

The present invention relates to a component supplying apparatus that supplies electronic components by causing a tape in which the electronic components are accommodated to travel, a component mounting apparatus including the component supplying apparatus, and a component supplying method.

2. Description of the Related Art

A mounting apparatus that mounts electronic components on a circuit board includes a detachable tape feeder that supplies the electronic components to the mounting apparatus. On a tape of the tape feeder, component accommodating holes and pitch feeding holes are formed at predetermined pitches in a longitudinal direction of the tape (see, for example, FIG. 5 of Japanese Patent No. 2917826; hereinafter, referred to as Patent Document 1). The electronic components are accommodated in the component accommodating holes. In general, by teeth of a sprocket provided in the tape feeder being inserted into the pitch feeding holes and the sprocket rotating a certain angle each time, the electronic components are supplied one at a time while the tape is caused to travel by the tape feeder. A nozzle is provided in a mounting head portion, and the nozzle extracts and holds one electronic component to be supplied to a predetermined rotational angle position by the tape feeder.

The mounting method disclosed in Patent Document 1 involves calculating a deviation amount caused when the nozzle holds an electronic component based on an image taken by a camera. Specifically, by a first electronic-component-holding operation, for example, a deviation amount between a center position of an electronic component and a center position of the nozzle is calculated, and information on the deviation amount is stored in a storage portion. Then, at a time a second holding operation by the nozzle is carried out, a position of the nozzle is corrected with respect to a reference position by an amount corresponding to the previous (first) deviation amount stored in the storage portion. After that, the electronic component is mounted on a circuit board. By carrying out such a correction that is based on the deviation amount every time a holding operation is carried out, an instructed holding position of the nozzle gradually approaches the center of the electronic component every time the holding operation is carried out.

SUMMARY OF THE INVENTION

In general, a rotational power source of a sprocket is a motor, and by transmitting power that is obtained by slowing down a rotating speed of the motor by a reducer to the sprocket, the sprocket rotates a certain angle each time. In this case, a production dimension error is included in gears used in the reducer, and especially an eccentricity of the gears (state where pitch circles with respect to rotational centers of gears are unconstant) directly affects a stopping accuracy of the gears. Eccentric amounts normally increase as a size of the gears increases, and the eccentric amount of the gear on an output side of the reducer affects an accuracy of a tape stopping position, that is, a supplying position of a component with respect to the nozzle. Therefore, if the eccentric amounts of the gears are large, an accuracy of the component supplying position is lowered. A period of the eccentric amounts of the gears as described above coincide with a rotational period of the gears.

The method disclosed in Patent Document 1 merely involves calculating a mean value of a plurality of stored deviation amounts of the past every time a component holding operation is carried out, and using the calculated value as a correction amount of the component holding positions, that is, the component supplying positions. Here, considering the deviation amounts of the component supplying positions that correspond to the eccentric amounts of the gears, the deviation amounts are periodical and a mean value of the deviation amounts becomes substantially 0. Therefore, since the correction amount approaches 0 with time when the mean value of the deviation amounts of the component supplying positions corresponding to the eccentric amounts of the gears is used as the correction amount as in the method of Patent Document 1, it becomes difficult to correct the deviation amounts.

In view of the circumstances as described above, there is a need for a component supplying apparatus, a component mounting apparatus, a component supplying method, a positioning apparatus, and a positioning method that are capable of correcting a deviation of a component supplying position even when there is a production dimension error of a gear used in a transmitting mechanism such as a reducer.

According to an embodiment of the present invention, there is provided a component supplying apparatus including a motor, a rotating body, a transmitting mechanism, and a predicting means.

The rotating body engages with a carrier tape in which a plurality of components to be mounted on a circuit board by a component mounting apparatus are accommodated at predetermined pitches and pays out the carrier tape at the predetermined pitches for supplying the plurality of components.

The transmitting mechanism transmits a driving force of the motor to the rotating body.

The predicting means predicts a deviation amount of a supplying position of each of the plurality of components based on a model formula expressing a periodical fluctuation of the supplying position of each of the plurality of components that is due to the transmitting mechanism and caused at a time the carrier tape is paid out by the rotating body.

As described above, the predicting means predicts the deviation amount of the component supplying position based on the model formula expressing the periodical fluctuation of the component supplying position that is due to the transmitting mechanism. Therefore, even when there is a production dimension error in the gears used in the transmitting mechanism, by the component mounting apparatus or the component supplying apparatus compensating for the deviation amount based on information on the deviation amount, the component can be mounted at an accurate position on the circuit board.

The component supplying apparatus may further include a correcting means for correcting the supplying position of each of the plurality of components such that the deviation amount predicted by the predicting means is compensated for.

As described above, since the component supplying apparatus includes the correcting means, a correcting means for compensating for the deviation amount does not need to be provided in the component mounting apparatus. In this case, information for compensating for the deviation amount does not need to be exchanged between the component supplying apparatus and the component mounting apparatus, and the component supplying apparatus can be applied to various component mounting apparatuses.

The transmitting mechanism includes a gear group constituted of a plurality of gears. In this case, the predicting means may predict the deviation amount using a first formula that expresses, by a function, the fluctuation of the supplying position of each of the plurality of components that is due to each of the plurality of gears and a second formula that expresses, by a function obtained by adding each of the functions, the fluctuation of the supplying position of each of the plurality of components that is overall due to the gear group.

The component supplying apparatus may further include a storage device to store information of the model formula.

For example, if the storage device is a nonvolatile storage device, the information on the model formula is not lost even when power supply to the component supplying apparatus is shut off. Therefore, the component supplying apparatus can resume an operation using the stored information on the model formula at a time power is supplied next. Even when the storage device is a volatile storage device, the component supplying apparatus only needs to be provided with a battery as described below.

Specifically, the component supplying apparatus may further include a battery and a backup means for supplying power from the battery to the component supplying apparatus at a time power supply to the component supplying apparatus is shut off.

According to an embodiment of the present invention, there is provided a component mounting apparatus including a substrate arranging portion, a component supplying apparatus, and a mounting mechanism.

A circuit board is placed on the substrate arranging portion.

The component supplying apparatus includes a motor, a rotating body that engages with a carrier tape in which a plurality of components to be mounted on the circuit board by the component mounting apparatus are accommodated at predetermined pitches and pays out the carrier tape at the predetermined pitches for supplying the plurality of components, a transmitting mechanism that transmits a driving force of the motor to the rotating body, and a predicting means for predicting a deviation amount of a supplying position of each of the plurality of components based on a model formula expressing a periodical fluctuation of the supplying position of each of the plurality of components that is due to the transmitting mechanism and caused at a time the carrier tape is paid out by the rotating body.

The mounting mechanism includes a holder that picks up and holds each of the plurality of components from the carrier tape paid out by the rotating body and mounts the picked-up component on the circuit board placed on the substrate arranging portion.

The component supplying apparatus may further include a correcting means for correcting the supplying position of each of the plurality of components such that the deviation amount predicted by the predicting means is compensated for.

The mounting mechanism may correct a position at which each of the plurality of components is held by the holder such that the deviation amount predicted by the predicting means is compensated for. By thus correcting the component holding position, the component is mounted at an accurate position on the circuit board.

According to an embodiment of the present invention, there is provided a component supplying method for a component supplying apparatus including a motor, a rotating body that engages with a carrier tape in which a plurality of components to be mounted on a circuit board by a component mounting apparatus are accommodated at predetermined pitches and pays out the carrier tape at the predetermined pitches for supplying the plurality of components, and a transmitting mechanism that transmits a driving force of the motor to the rotating body.

A deviation amount of a supplying position of each of the plurality of components is predicted based on a model formula expressing a periodical fluctuation of the supplying position of each of the plurality of components that is due to the transmitting mechanism and caused at a time the carrier tape is paid out by the rotating body.

The predicted deviation amount is compensated for.

According to an embodiment of the present invention, there is provided a positioning apparatus including a motor, a rotating body, a transmitting mechanism, and a predicting means.

The rotating body rotates by a driving force of the motor.

The transmitting mechanism transmits the driving force of the motor to the rotating body.

The predicting means predicts a deviation amount of a stopping position of the rotating body based on a model formula expressing a periodical fluctuation of the stopping position of the rotating body that is due to the transmitting mechanism.

According to an embodiment of the present invention, there is provided a method of positioning a rotating body of a component supplying apparatus including a motor, the rotating body that rotates by a driving force of the motor, and a transmitting mechanism that transmits the driving force of the motor to the rotating body.

A deviation amount of a stopping position of the rotating body is predicted based on a model formula expressing a periodical fluctuation of the stopping position of the rotating body that is due to the transmitting mechanism.

The predicted deviation amount is compensated for.

According to the embodiments of the present invention, a deviation of a component supplying position can be corrected even when there is a production dimension error in gears used in a transmitting mechanism such as a reducer.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will be described with reference to the drawings.

(Structure of Component Mounting Apparatus)

Figure 1:
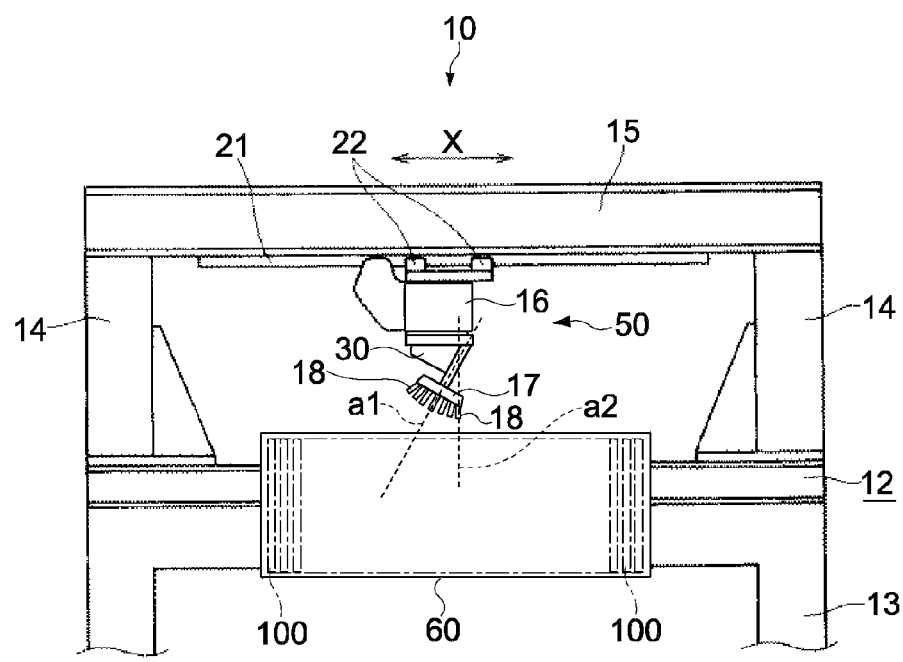
FIG. 1 is a front view of a component mounting apparatus according to an embodiment of the present invention.
Figure 1:
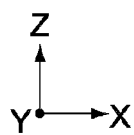
Figure 2:
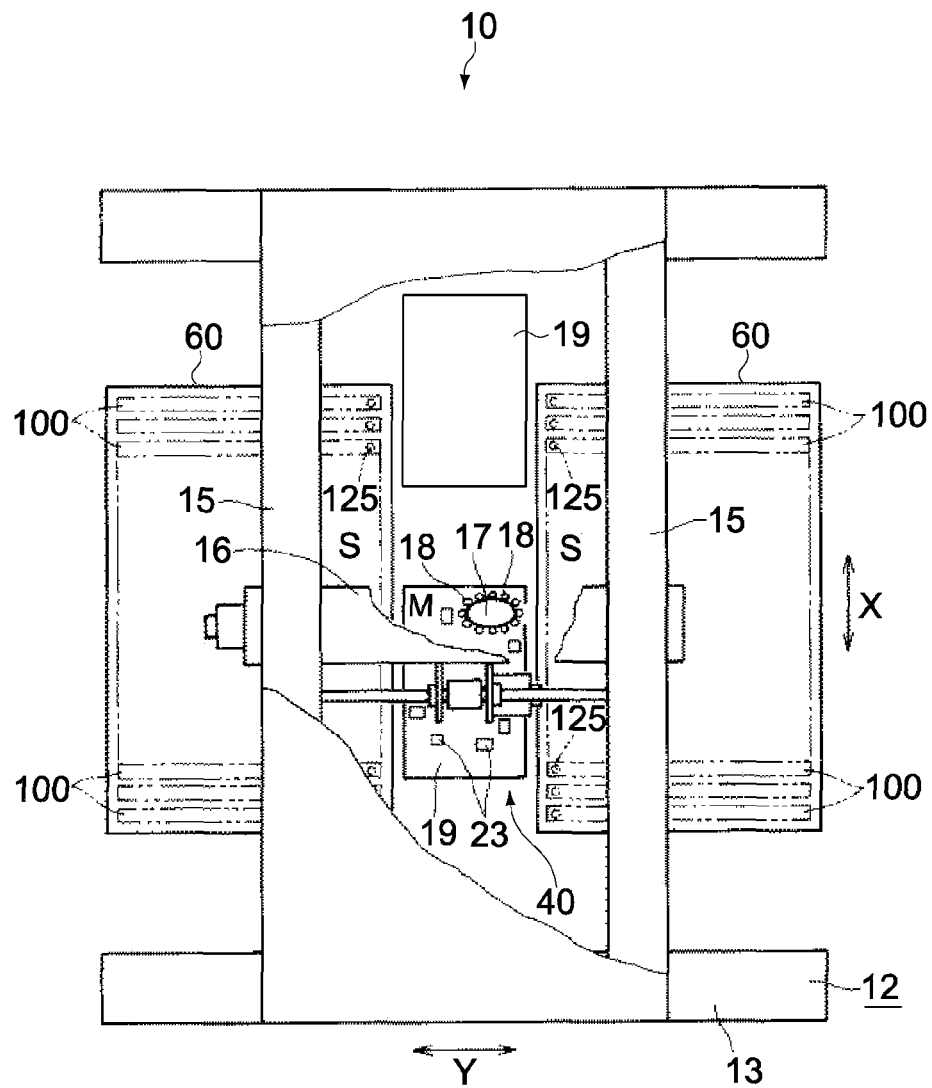
FIG. 2 is a plan view of the partially-fractured component mounting apparatus.
Figure 3:
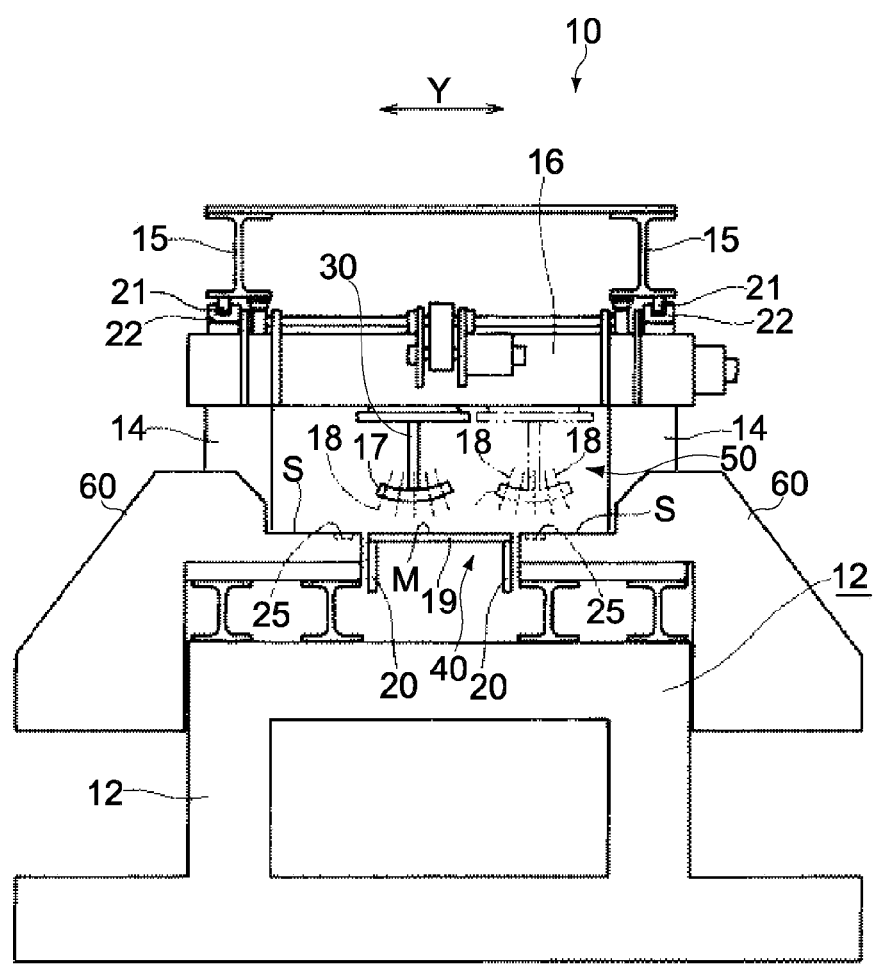
FIG. 3 is a side view of the component mounting apparatus.

FIG. 1 is a front view of a component mounting apparatus 10 according to an embodiment of the present invention. FIG. 2 is a plan view of the partially-fractured component mounting apparatus 10. FIG. 3 is a side view of the component mounting apparatus 10.

The component mounting apparatus 10 includes a substrate arranging portion 40 which is provided substantially at the center of the component mounting apparatus 10 and on which a circuit board 19 is placed, and tape-feeder arranging portions 60 disposed on both sides of the substrate arranging portion 40 and on which tape feeders 100 as component supplying apparatuses are disposed. Further, the component mounting apparatus 10 includes a mounting mechanism 50 that mounts electronic components supplied from the tape feeders 100 on the circuit board 19 placed on the substrate arranging portion 40.

For example, the component mounting apparatus 10 includes a base portion 12, a pedestal 13 that supports the base portion 12, a plurality of supporting columns 14 erected on the pedestal 13, and a beam 15 bridged between, for example, two supporting columns 14. With four supporting columns 14, for example, two beams 15 are provided. In descriptions below, a direction in which the beam 15 extends may be referred to as X-axis direction, a direction orthogonal to the X axis within a horizontal plane may be referred to as Y-axis direction, and a vertical direction may be referred to as Z-axis direction.

The mounting mechanism 50 includes sucking nozzles 18 each as a holder for picking up the electronic component from the tape feeder 100 and holding it, a rotatable tool head 17 to which the sucking nozzles 18 are attached, and a carriage 30 that holds the tool head 17. A movable body 16 that extends in the Y-axis direction and is movable in the X-axis direction is bridged between the beams 15. The carriage 30 is attached while being movable in the Y-axis direction along the movable body 16. Therefore, each of the sucking nozzles 18 attached to the tool head 17 is movable within the horizontal plane (X-Y plane) due to the carriage 30 and the movable body 16.

Typically, a guide rail 21 extending in the X-axis direction is provided on a lower surface of each of the beams 15. Guided bodies 22 fixed on an upper surface of the movable body 16 at both end portions are slidably engaged with the guide rails 21. Accordingly, the movable body 16 is movable in the X-axis direction along the beams 15. It should be noted that although a belt driving mechanism, for example, is used as a driving system for moving the movable body 16, the present invention is not limited thereto, and a ball screw driving mechanism, a linear motor driving mechanism, a rack-and-pinion driving mechanism, or other driving mechanisms may be used instead.

As described above, the carriage 30 is movable in the Y-axis direction by a drive of a ball screw provided inside the movable body 16. Also in this case, a belt driving mechanism, a linear motor driving mechanism, a rack-and-pinion driving mechanism, or other driving mechanisms may be used instead of the ball screw driving mechanism.

The substrate arranging portion 40 is provided with a fixing mechanism 20 for supporting and fixing the circuit board 19 from the bottom. The circuit board 19 is positioned by the fixing mechanism 20. In this embodiment, two circuit boards 19 are placed on the substrate arranging portion 40 with a predetermined gap therebetween. However, the number of circuit boards 19 to be placed is not limited.

The tool head 17 is hung from the carriage 30. The tool head 17 is rotatable in a forward direction and a backward direction by a built-in motor (not shown). As shown in FIG. 1, a main rotary axis a1 of the tool head 17 is tilted with respect to the Z-axis direction.

The tool head 17 is provided with, for example, at an outer circumferential portion thereof, 12 sucking nozzles 18 disposed at regular intervals in a circumferential direction. The sucking nozzle 18 only needs to be provided plurally, and the number of sucking nozzles 18 may be smaller or larger than 12. Each of the sucking nozzles 18 is attached to the tool head 17 such that an axis line thereof is tilted with respect to the main rotary axis a1 of the tool head 17. The tilt is made such that an upper end of the sucking nozzle 18 comes closer to the main rotary axis a1 of the tool head 17 than a lower end thereof. In other words, as a whole, the 12 sucking nozzles 18 are provided to the tool head 17 so as to be widened toward the end.

Each of the sucking nozzles 18 is supported by the tool head 17 to be movable in an axial direction and is lowered by being pressed downward by a pressing mechanism (not shown) when the sucking nozzle 18 is positioned at an operating position to be described later. The pressing mechanism may be any mechanism such as a cam mechanism, a ball screw mechanism, a solenoid, and an air pressure generating mechanism.

The axis line of the sucking nozzle 18 at a far right end on a rear end side of the tool head 17 in FIG. 1 faces the Z-axis direction, and that position on the rear end side corresponds to the operating position. The electronic component is sucked and held or released by the sucking nozzle 18 facing the vertical direction at the operating position.

There are a plurality of types of electronic components to be mounted on a single circuit board 19, but different types of electronic components cannot be sucked and mounted by a single type of sucking nozzle 18. In this regard, a plurality of types of sucking nozzles 18 are provided to suck and mount electronic components respectively corresponding to optimal sucking nozzles 18. Examples of the electronic component include various components such as an IC chip, a resistor, a capacitor, and a coil.

The sucking nozzle 18 is connected to an air compressor (not shown), and a tip end portion of the sucking nozzle 18 positioned at the operating position is switched between a positive pressure and a negative pressure at predetermined timings. Accordingly, the tip end portion sucks or releases the electronic component.

An area occupied by the circuit board 19 positioned and held by the fixing mechanism 20 constitutes a component mounting area M.

As shown in FIG. 2, on the tape-feeder arranging portions 60 disposed on both the left- and right-hand sides of the component mounting area M, a plurality of tape feeders 100 are provided detachably. The plurality of tape feeders 100 are arranged in, for example, the X-axis direction. Though it is possible to mount 40 tape feeders 100 on each of the tape-feeder arranging portions 60, for example, the number of tape feeders 100 is not limited. A carrier tape 1 of a single tape feeder 100 to be described later accommodates a large number of electronic components of the same type. Each of the tape feeders 100 supplies those electronic components to the sucking nozzles 18 as necessary.

Types of electronic components accommodated in the tape feeders 100 are different for each of the tape feeders 100. The sucking nozzle 18 and the tape feeder 100 are selected in accordance with which electronic component is to be mounted at what position on the circuit board 19. Thus, the selected nozzle sucks the electronic component.

It should be noted that although the tape-feeder arranging portions 60 are disposed on both the left- and right-hand sides of the component mounting area M in this embodiment, the tape-feeder arranging portions 60 may be provided on only one of the left- and right-hand sides of the component mounting area M.

A component supplying port 125 is provided at one end portion of each of the tape feeders 100. Each of the tape feeders 100 is mounted on the corresponding one of the tape-feeder arranging portions 60 such that the end portion to which the component supplying port 125 is provided faces the component mounting area M side. Each of the sucking nozzles 18 picks up the electronic component via the component supplying port 125. An area occupied by the sucking nozzle 18 when picking up the electronic component as described above or an area occupied by the tool head 17 at that time (area including operating position above) is set as a component supplying area S. The sucking nozzle 18 of the tool head 17 at the operating position moves inside the component supplying area S, the component mounting area M, and an area connecting those areas S and M.

First, the tool head 17 moves to the component supplying area S and sequentially sucks given electronic components using 12 sucking nozzles 18 provided to the tool head 17. Then, the tool head 17 moves to the component mounting area M and sequentially mounts the electronic components sucked by the sucking nozzles 18 at predetermined positions on the circuit board 19 while adjusting movements in the X- and Y-axis directions. The tool head 17 is moved in the X- and Y-axis directions by the movable body 16 and the carriage 30 described above. By repeating this operation, the electronic components are mounted on the circuit board 19.

The component mounting apparatus 10 includes a camera (not shown). This camera includes devices such as a CCD and a CMOS and photographs a sucked state of the electronic components by the sucking nozzles 18. The camera is provided so as to integrally move with the movable body 16, for example, and receives image light indicating the sucked state of the electronic components via an optical system such as a mirror (not shown). An image of the sucked state taken by the camera is subjected to image processing by software or the like included in a control system 145 of the component mounting apparatus 10 to be described later. As a result, the sucked state is judged.

(Structure of Tape Feeder)

Figure 4:
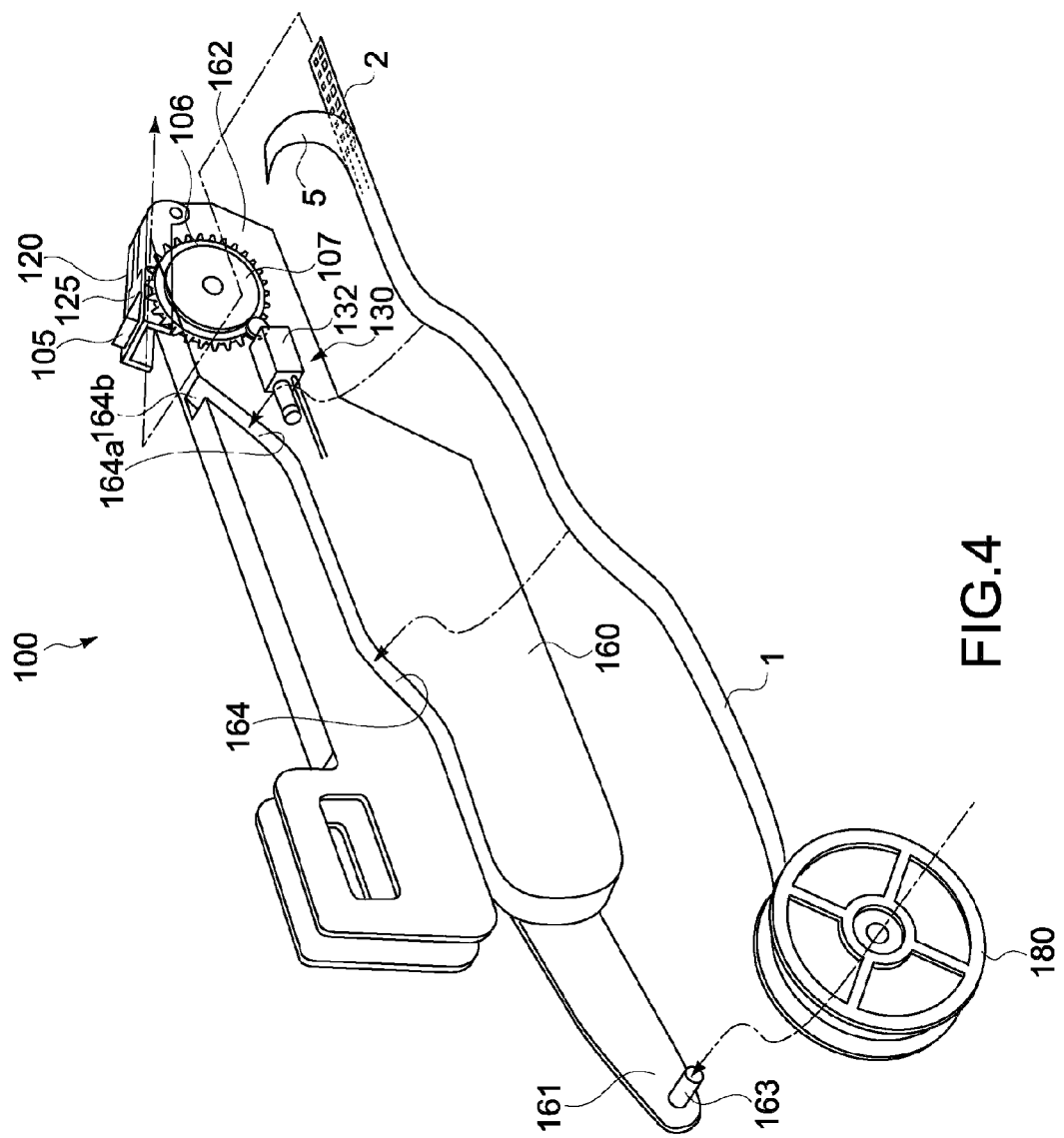
FIG. 4 is an exploded perspective view schematically showing a tape feeder.
Figure 5:
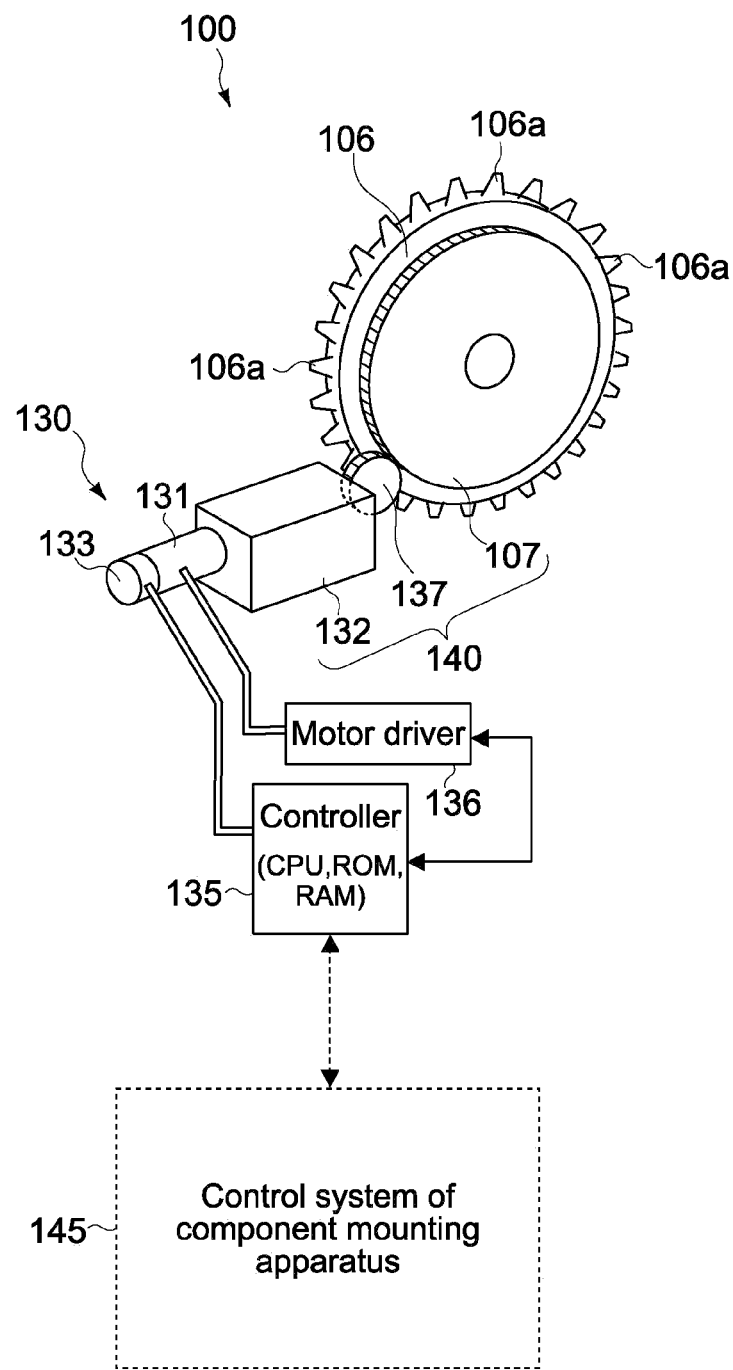
FIG. 5 is a perspective view showing a main portion of the tape feeder.

FIG. 4 is an exploded perspective view schematically showing the tape feeder 100. FIG. 5 is a perspective view showing a main portion of the tape feeder 100.

Figure 6:
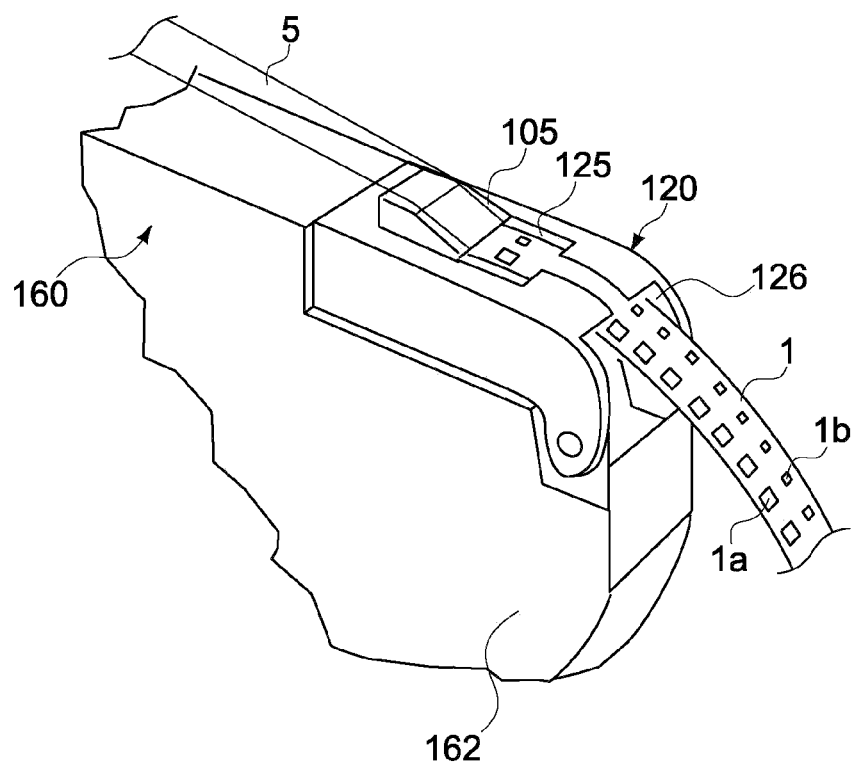
FIG. 6 is a perspective view of a front end side of a chassis of the tape feeder.

The tape feeder 100 includes a chassis 160, a sprocket 106 as a rotating body that is rotatably provided at one end portion of the chassis 160, and a rotary drive mechanism 130 that drives the sprocket 106. At one end portion of the chassis 160, an openable cover 120 is attached. On the other end portion of the chassis 160 on the other side of the one end portion, a protrusion 163 with which a reel 180 around which the carrier tape 1 is wound engages is provided. As shown in FIG. 6, concave portions 1*a* are formed on the carrier tape 1 in a longitudinal direction at predetermined pitches, and electronic components (not shown) are accommodated in the concave portions 1*a*.

In descriptions below, the one end portion of the chassis 160 will be referred to as front end 162, whereas the other end portion of the chassis 160 will be referred to as rear end 161. Also, regarding those directions, a direction extending from the rear end 161 to the front end 162 will be referred to as forward direction, whereas the opposite direction will be referred to as backward direction.

The chassis 160 is, for example, horizontally long and includes a horizontally-long path 164 through which the carrier tape 1 drawn out from the reel 180 passes. One end portion 164*a* of the path 164 is formed to tilt upwardly toward the front end 162 of the chassis 160, and the path 164 is exposed via an opening 164*b* formed on an upper surface of the chassis 160. The carrier tape 1 is drawn out from the opening 164*b* and engages with teeth 106*a* of the sprocket 106 exposed between the cover 120 and the front end 162 of the chassis 160 as shown in FIG. 5.

FIG. 6 is a perspective view of the front end 162 side of the chassis 160. FIG. 6 shows a state where the cover 120 is closed. On the carrier tape 1, pitch feeding holes (perforations) 1*b* are formed in the longitudinal direction of the carrier tape 1 so as to correspond to the concave portions 1*a* in which the electronic components are accommodated. The teeth 106*a* of the sprocket 106 engage with the pitch feeding holes 1*b*. Therefore, by the rotation of the sprocket 106, the carrier tape 1 is drawn out from the opening 164*b* to be paid out in the longitudinal direction.

The component supplying port 125 described above is provided on the cover 120. At a front end of the cover 120, an outlet 126 from which the carrier tape 1 is paid out is provided. The carrier tape 1 includes a cover tape 5 attached to a tape body for accommodating the electronic components. At an edge of the component supplying port 125, a peeling portion 105 of the cover tape 5 is provided. The peeling portion 105 peels off the cover tape 5 from the tape body by folding back the cover tape 5 with respect to a forwarding direction of the carrier tape 1 (direction of front end 162). The peeled cover tape 5 is recovered by a mechanism (not shown). By the sprocket 106 rotating a predetermined rotational angle in correspondence with the pitch feeding holes 1b each time for successively and continuously supplying the electronic components to the component supplying port 125, the carrier tape 1 is paid out at pitches of the pitch feeding holes 1b.

As shown in FIG. 5, the rotary drive mechanism 130 includes a motor 131, a gear box 132 as a reducer for reducing an output of the motor 131 at a predetermined reduction ratio, and a transmitting gear 137 that transmits power output from the gear box 132 to a spur gear 107 provided in the sprocket 106. The gear box 132, the transmitting gear 137, and the spur gear 107 constitute a transmitting mechanism 140. It should be noted that although the gear box 132 and the transmitting gear 137 are illustrated as different components in FIG. 5, it is also possible for the gear box 132 to include the transmitting gear 137.

Figure 7:
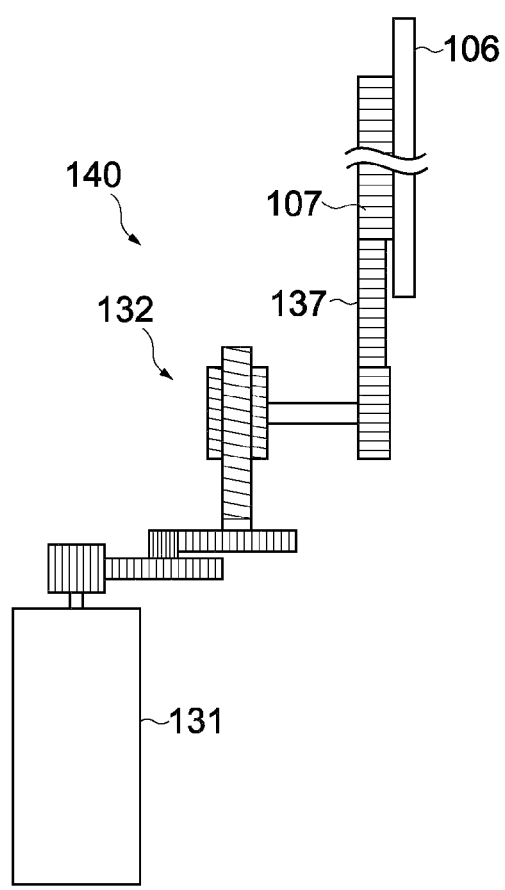
FIG. 7 is a diagram showing a structure of a gear box of a rotary drive mechanism in particular.

FIG. 7 is a diagram showing a structure of the gear box 132 of the rotary drive mechanism 130 in particular. The gear box 132 includes a plurality of gears. By setting the number of teeth of those plurality of gears, the transmitting gear 137, and the spur gear 107, a reduction ratio of the motor 131 and the sprocket 106 is set. The plurality of gears in the gear box 132, the transmitting gear 137, and the spur gear 107 constitute a gear group.

Connected to the motor 131 is a rotational position detector 133 that detects a rotational position of the motor 131. The motor 131 is driven under control of a motor driver 136, and a detection signal from the rotational position detector 133 is input to a controller 135 so that a control signal is output to the motor driver 136. The controller 135 is electrically connected to the control system 145 of the component mounting apparatus 10. For example, the controller 135 controls a supplying amount, a supplying timing, a supplying speed, and the like of the carrier tape 1 using the motor driver 136, and communicates various types of data with the control system 145 of the component mounting apparatus 10.

The controller 135 includes a CPU (Central Processing Unit), a ROM (Read Only Memory), a RAM (Random Access Memory), and the like. In addition to the ROM and the RAM, a nonvolatile memory such as a flash memory may be used as the storage device. Instead of the CPU, a DSP (Digital Signal Processor), an FPGA (Field Programmable Gate Array), an ASIC (Application Specific Integrated Circuit), or the like may be used. The control system 145 of the component mounting apparatus 10 also includes a CPU, a ROM, a RAM, and the like.

Though a servo motor is typically used as the motor 131, other types of motors may be used instead. As the rotational position detector 133, a rotary encoder, a resolver, or the like may be used. Any of an optical encoder, a magnetic encoder, and the like may be used as the rotary encoder.

(Outline of Operation of Component Mounting Apparatus)

An outline of operations of the component mounting apparatus 10 and the tape feeders 100 structured as described above will be described.

The control system 145 of the component mounting apparatus 10 transmits a command signal to the tape feeder 100 so that a predetermined electronic component is arranged in the component supplying port 125. The tape feeder 100 causes the motor driver 136 to drive the motor 131 in response to the command signal and arranges (supplies) the electronic component in (to) the component supplying port 125. After completing the supply of the electronic component, the tape feeder 100 outputs a response signal notifying the supply completion to the control system 145 of the component mounting apparatus 10. After the control system 145 receives the response signal, the mounting mechanism 50 sucks and holds the electronic component arranged in the component supplying port 125 by the sucking nozzle 18 and mounts the electronic component on the circuit board 19 placed on the substrate arranging portion 40.

It should be noted that in this embodiment, 12 sucking nozzles 18 are attached to the tool head 17. Therefore, the component mounting apparatus 10 repeats the operation of supplying an electronic component and sucking the supplied electronic component 12 times in a row and mounts the electronic component on a single circuit board 19 12 times in a row after that.

(Deviation of Supplying Position of Electronic Component)

Next, a deviation of a supplying position of an electronic component that is caused at a time the tape feeder 100 supplies the electronic component will be described.

As shown in FIG. 7, a plurality of gears are provided in the transmitting mechanism 140 including the gear box 132. Those gears include production dimension errors, and especially an eccentricity of the gears directly affects a stopping accuracy of the gears. Specifically, the inventors of the present invention have found that eccentric amounts of those gears affect an accuracy of a stopping position of the carrier tape 1, that is, supplying positions of the electronic components (supplying positions in longitudinal direction of carrier tape 1).

Figure 8:
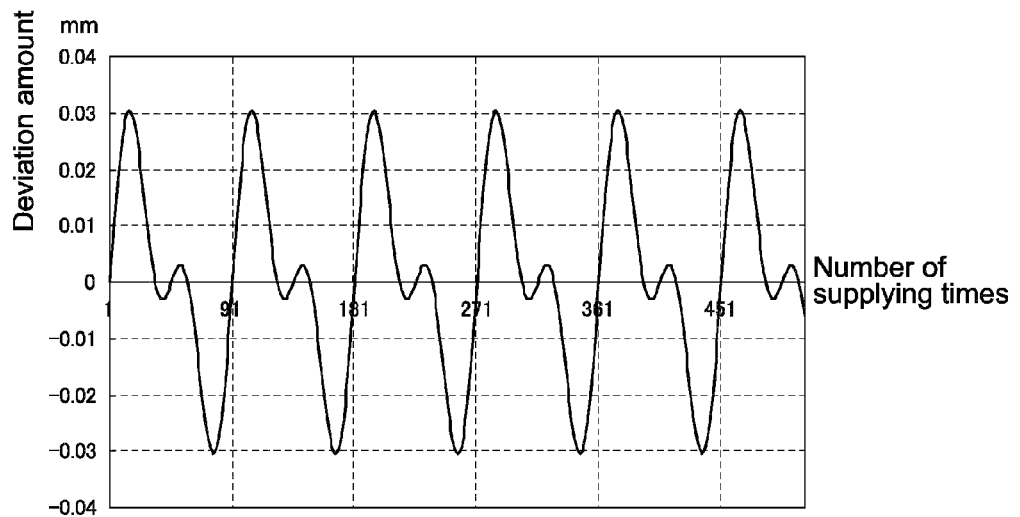
FIG. 8 is a graph showing deviation amounts due to eccentric amounts of a gear group of a transmitting mechanism in a feeding direction of a carrier tape, that is, a longitudinal direction of the carrier tape at respective number of supplying times.

FIG. 8 is a graph showing deviation amounts due to the eccentric amounts of the gear group in a feeding direction of the carrier tape 1, that is, the longitudinal direction of the carrier tape 1, at the respective number of supplying times. The sprocket 106 rotates once every time 90 electronic components are supplied. In the case of this example, if positions at which the electronic components are sucked by the sucking nozzles 18 are substantially constant, deviation amounts of the sucking positions of the electronic components with respect to the sucking nozzles 18, that is, deviation amounts of the supplying positions of the electronic components become ±0.03 mm at maximum. Hereinafter, the supplying position of the electronic component will be simply referred to as "supplying position".

As the electronic components, there are various components such as a chip part having a size of 0.6 mm×0.3 mm and a chip part having a size of 0.4 mm×0.2 mm. Those chip parts are accommodated in the carrier tape 1 such that longitudinal directions thereof having smaller widths than lateral directions match the longitudinal direction of the carrier tape 1. In this case, assuming that a deviation amount of a relative position between the sucking nozzle 18 and the carrier tape 1 allowable in the longitudinal direction of the carrier tape 1 is 20% the width of the chip part, the deviation amount is as small as ±0.04 mm.

Figure 9:
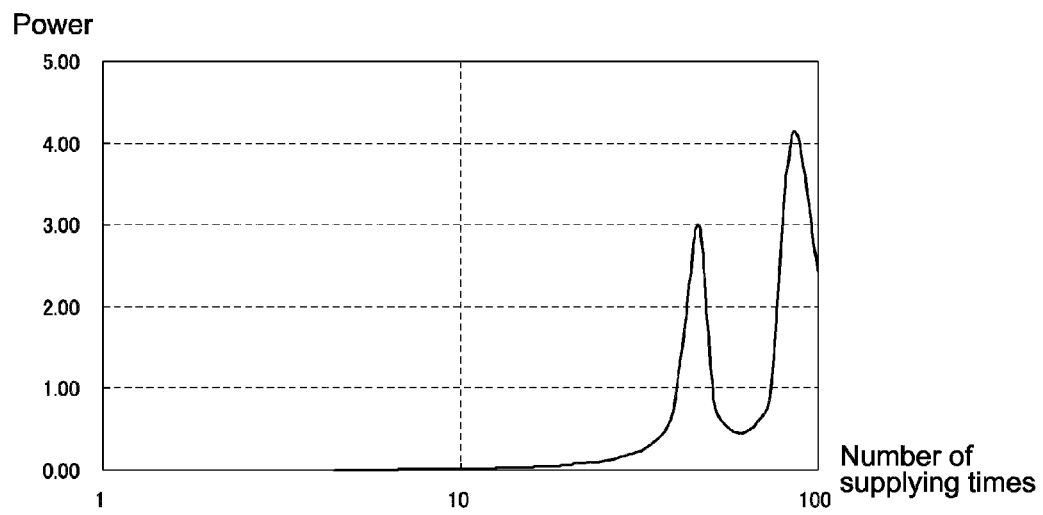
FIG. 9 is a graph showing an example in which an FFT (Fast Fourier Transform) analysis is carried out on the deviation amounts of the supplying positions shown in FIG. 8.

FIG. 9 is a graph showing an example in which an FFT (Fast Fourier Transform) analysis is carried out on the deviation amounts of the supplying positions shown in FIG. 8. As shown in FIG. 9, power peaks appear at a feed count 90 and a feed count 45 that is the half of 90. In other words, the power peaks coincide with a rotational period of the sprocket 106. Therefore, it can be seen that the deviation amounts of the supplying positions are mainly due to the eccentric amounts of the gear group. The waveform shown in FIG. 8 is a mere example, and there are individual differences even if the structure of the transmitting mechanism is the same.

A waveform of a deviation amount due to an eccentric amount of a single gear is approximated as a sine wave. Moreover, a deviation amount of the supplying position is expressed as an overall sum of the eccentric amounts of the gear group.

The eccentric amounts of the gear group of the transmitting mechanism 140 normally increase as sizes of the gears increase and also increase more on an output side of the transmitting mechanism 140. Thus, although formulations are structured for the transmitting gear 137 (gear 1) and the spur gear 107 (gear 2) in the transmitting mechanism 140 of this embodiment for brevity, it is also possible to structure a formulation for a plurality of gears by merely adding an item.

Assuming that a fluctuation of a supplying position caused by the gear 1 is represented by $x_1$ and that caused by the gear 2 is represented by $x_2$, $x_1$ and $x_2$ can be expressed by Equations (1) and (2) below that are each a trigonometric function.

[Expression 1]

$$x_1 = a_1 \sin\left(\frac{2\pi}{T_1} t + \alpha_1\right) \quad (1)$$

$$x_2 = a_2 \sin\left(\frac{2\pi}{T_2} t + \alpha_2\right) \quad (2)$$

where $a_1$ and $a_2$ respectively represent influence rates of the gears 1 and 2 on the supplying positions, $T_1$ and $T_2$ represent rotational periods of the respective gears (number of supplying times required to rotate each gear once), t represents the number of supplying times, $\alpha_1$ and $\alpha_2$ represent initial phases of the respective gears, and $a_1$, $a_2$, $\alpha_1$, and $\alpha_2$ are unknown fixed values with respect to known values of $T_1$ and $T_2$ Using $x_1$ and $x_2$, the supplying position can be expressed by Equation (3) below.

[Expression 2]

$$y = x_1 + x_2 + e \quad (3)$$

where e represents an error including a deviation amount of a supplying position caused by a small gear and other deviation amounts caused at random Equations (1) and (2) express fluctuations of the supplying positions that are due to the respective gears, whereas Equation (3) expresses a fluctuation of the supplying position that is overall due to the gear group, that is, two gears in this case.

As described above, $a_1$, $a_2$, $\alpha_1$, and $\alpha_2$ are values that are fixed in terms of a mechanical structure, and $T_1$ and $T_2$ are known values since they represent the rotational periods of the gears. Therefore, if $a_1$, $a_2$, $\alpha_1$, and $\alpha_2$ can be specified, the fluctuation of the supplying position can be predicted. Two methods of predicting a fluctuation of a supplying position will be described below.

(First Method)

In a first method, first to third order differentials of y are first considered based on Equation (3) above.

[Expression 3]

$$\dot{y} = \dot{x}_1 + \dot{x}_2 + \dot{e} \quad (4)$$

$$\ddot{y} = \ddot{x}_1 \ddot{x}_2 + \ddot{e} \quad (5)$$

$$\dddot{y} = \dddot{x}_1 + \dddot{x}_2 + \dddot{e} \quad (6)$$

A differential of x is given as expressed in Equations (7) and (8) below.

[Expression 4]

$$\frac{d}{dt}\begin{bmatrix} x_1 \\ \dot{x}_1 \\ x_2 \\ \dot{x}_2 \end{bmatrix} = \begin{bmatrix} 0 & 1 & 0 & 0 \\ -\left(\frac{2\pi}{T_1}\right)^2 & 0 & 0 & 0 \\ 0 & 0 & 0 & 1 \\ 0 & 0 & -\left(\frac{2\pi}{T_2}\right)^2 & 0 \end{bmatrix} \begin{bmatrix} x_1 \\ \dot{x}_1 \\ x_2 \\ \dot{x}_2 \end{bmatrix} \quad (7)$$

[Expression 5]

$$X = \begin{bmatrix} x_1 \\ \dot{x}_1 \\ x_2 \\ \dot{x}_2 \end{bmatrix} A = \begin{bmatrix} 0 & 1 & 0 & 0 \\ -\left(\frac{2\pi}{T_1}\right)^2 & 0 & 0 & 0 \\ 0 & 0 & 0 & 1 \\ 0 & 0 & -\left(\frac{2\pi}{T_2}\right)^2 & 0 \end{bmatrix} \quad (8)$$

$$\dot{X} = A \cdot X$$

y is expressed as in Equation (9) below.

[Expression 6]

$$\begin{bmatrix} y \\ \dot{y} \\ \ddot{y} \\ \dddot{y} \end{bmatrix} = \begin{bmatrix} 1 & 0 & 1 & 0 \\ 0 & 1 & 0 & 1 \\ -\left(\frac{2\pi}{T_1}\right)^2 & 0 & -\left(\frac{2\pi}{T_2}\right)^2 & 0 \\ 0 & -\left(\frac{2\pi}{T_1}\right)^2 & 0 & -\left(\frac{2\pi}{T_2}\right)^2 \end{bmatrix} \begin{bmatrix} x_1 \\ \dot{x}_1 \\ x_2 \\ \dot{x}_2 \end{bmatrix} + \begin{bmatrix} e \\ \dot{e} \\ \ddot{e} \\ \dddot{e} \end{bmatrix} \quad (9)$$

When the following is established based on Equation (9)

[Expression 7]

$$Y = \begin{bmatrix} y \\ \dot{y} \\ \ddot{y} \\ \dddot{y} \end{bmatrix}$$

$$C = \begin{bmatrix} 1 & 0 & 1 & 0 \\ 0 & 1 & 0 & 1 \\ -\left(\frac{2\pi}{T_1}\right)^2 & 0 & -\left(\frac{2\pi}{T_2}\right)^2 & 0 \\ 0 & -\left(\frac{2\pi}{T_1}\right)^2 & 0 & -\left(\frac{2\pi}{T_2}\right)^2 \end{bmatrix}$$

-continued $$E = \begin{bmatrix} e \\ \dot{e} \\ \ddot{e} \\ \dddot{e} \end{bmatrix}$$

Y can be expressed by Equation (10) below.

[Expression 8]

$$Y = C \cdot X + E \quad (10)$$

Since E represents noises with a mean value 0, Equation (10) can be expressed by Equation (11) below.

[Expression 9]

$$\dot{Y} = C \cdot \dot{X} = C \cdot A \cdot X \quad (11)$$

When an estimate value X obtained when the tape feeder 100 supplies the electronic components n times is represented by $X^{\wedge}(n:n)$ and an actual measurement value Y obtained by, for example, photographing with a camera is represented by $Y(n), Y(n) = C*X^{\wedge}(n:n)$ is established based on Equation (10).

Further, X estimated from (n−1)-th supply is represented by $X^{\wedge}(n:n−1)$, and Y estimated from the (n−1)-th supply is represented by $Y^{\wedge}(n:n−1)$. It should be noted that "^" refers to an "estimate" value, and for convenience of descriptions, "^" may sometimes be added at upper portions of "X" and "Y" or may sometimes be added next to "X" and "Y". In either case, the meanings are the same.

$X^{\wedge}(n:n−1)$ is obtained by adding, to the estimate value X obtained when the electronic components are supplied (n−1) times (t=n−1), that is, $X^{\wedge}(n−1:n−1)$, $A*X^{\wedge}(n−1:n−1)$ that is a latest differential value of X known at that time point (from Equation (8)). In other words, since $X^{\wedge}(n:n−1)$ can be expressed by $$X^{\wedge}(n: n-1) = X^{\wedge}(n-1:n-1) + A * X^{\wedge}(n-1:n-1)$$
$$= (I+A)X^{\wedge}(n-1:n-1) (I \text{ is a unit matrix}),$$

$X^{\wedge}(n:n−1)$ can be expressed by Equation (12) below.

[Expression 10]

$$\tilde{X}(n: n-1) = \begin{bmatrix} x_1 \\ \dot{x}_1 \\ x_2 \\ \dot{x}_2 \end{bmatrix}_{t=n-1} + \begin{bmatrix} 0 & 1 & 0 & 0 \\ -\left(\frac{2\pi}{T_1}\right)^2 & 0 & 0 & 0 \\ 0 & 0 & 0 & 1 \\ 0 & 0 & -\left(\frac{2\pi}{T_2}\right)^2 & 0 \end{bmatrix} \begin{bmatrix} x_1 \\ \dot{x}_1 \\ x_2 \\ \dot{x}_2 \end{bmatrix}_{t=n-1} \quad (12)$$

Therefore, Equation (12) can be expressed by Equation (13) below based on Equation (10).

$$Y^{\wedge}(n:n-1) = CX^{\wedge}(n:n-1) \quad (13)$$

At a time the estimate value $X^{\wedge}(n:n−1)$ in a state of t=n−1 is known, the estimate value $X^{\wedge}(n:n)$ in a state of t=n is expressed as in Equation (14) below.

$$X^{\wedge}(n:n) = X^{\wedge}(n:n-1) + C^{-1}(Y(n) - Y^{\wedge}(n:n-1)) \quad (14)$$

Here, although $Y(n)−Y^{\wedge}(n:n−1)$ as an error of the output Y is fed back every time $X^{\wedge}(n:n)$ is obtained, since the error includes a noise component, the system may become unstable if the error is directly fed back. In this regard, in actuality, for relieving a feedback amount, the following form is set by multiplying a gain matrix K to the error.

$$X^{\wedge}(n:n) = X^{\wedge}(n:n-1) + KC^{-1}(Y(n) - Y^{\wedge}(n:n-1)) \quad (15)$$

Equation (15) above will hereinafter be referred to as predicting model formula. The predicting model formula expresses a periodical fluctuation of the supplying positions of the electronic components that is due to the transmitting mechanism 140 and caused at the time the carrier tape 1 is paid out by the sprocket 106.

Figure 10:
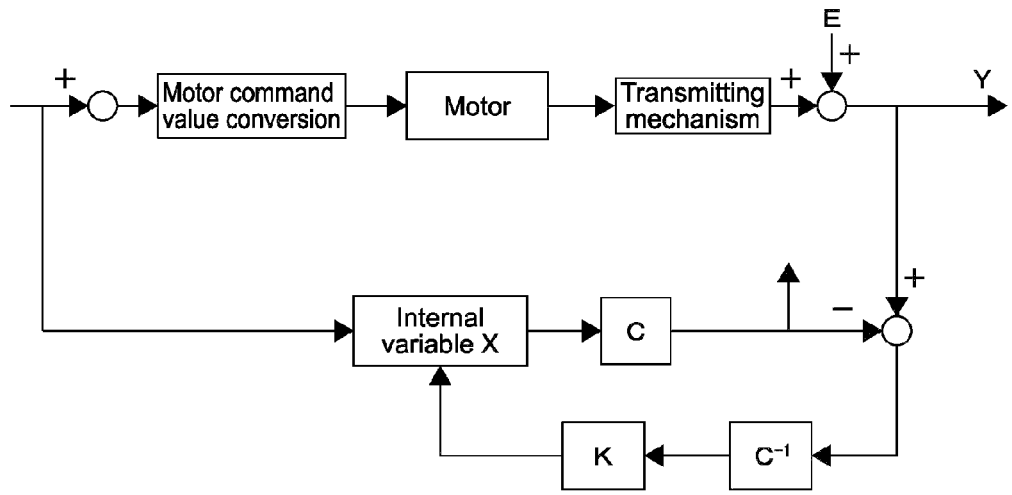
FIG. 10 is a block diagram showing an example of control according to this embodiment.

Expressing the formulations heretofore by a block diagram, the formulations can be expressed as in FIG. 10. In FIG. 10, $Y(n)−Y^{\wedge}(n:n−1)$ is a value corresponding to the deviation amount of the supplying position. In the block diagram, an input value that is input to a conversion block of a command value to the motor (131) is set to 0. In this embodiment, since it is only necessary to monitor a deviation amount of a rotational angle position of the sprocket 106, the input value that is input to the conversion block of the command value to the motor only needs to be set to 0. Specifically, the deviation amounts of the supplying positions are originally deviation amounts from supplying positions of electronic components in the carrier tape 1 paid out every certain rotational angle of the sprocket 106 in a case where it is assumed that there is no eccentric amount in the gears of the transmitting mechanism 140.

If the sucking positions of the sucking nozzles 18 are substantially constant, the deviation amounts of the supplying positions become deviation amounts from original sucking positions of those sucking nozzles 18. In this embodiment, it is considered that there is practically no positional deviation of the sucking nozzles 18 themselves.

The controller 135 of the tape feeder 100 transmits information on the deviation amounts of the supplying positions to the control system 145 of the component mounting apparatus 10. By the control system 145 receiving the information and controlling a movement of the sucking nozzles 18 by the mounting mechanism 50, the deviation amounts are compensated for.

Figure 11:
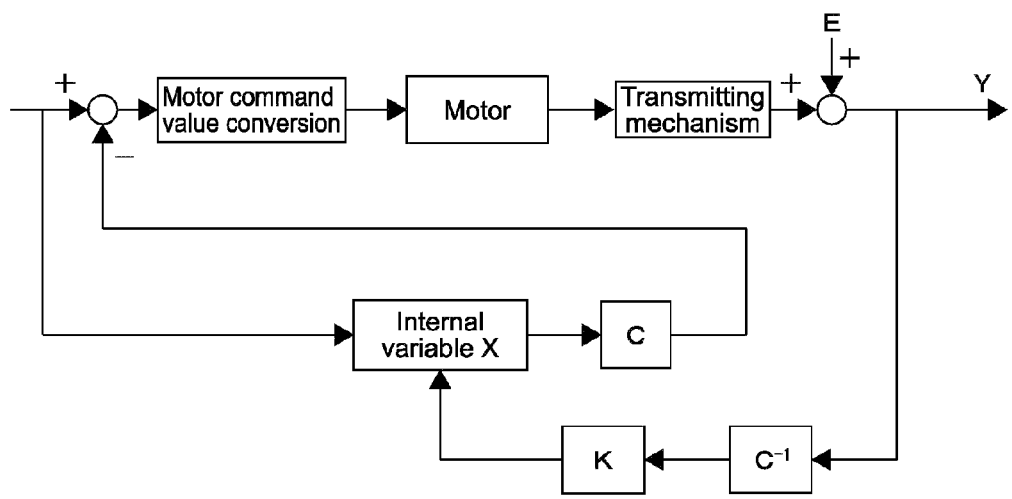
FIG. 11 is a block diagram showing another example of the control according to this embodiment.

FIG. 11 shows another example of the block diagram. In this example, a conversion value $KC^{-Y}(n)$ of an actual measurement value Y(n) to X and an estimate value $X^{\wedge}(n:n)$ are compared, and a differential amount becomes an amount corresponding to a command value to the motor. Specifically, by the control method of the block diagram, the tape feeder 100 itself controls a rotational amount of the sprocket 106 to correct the supplying positions and compensate for a predicted deviation amount. In both of FIGS. 10 and 11, the same repetitive calculation is used for identifying an internal variable.

Since the tape feeder 100 itself thus corrects the supplying positions, there is no need to provide a correcting means for compensating for the deviation amount. In this case, the tape feeder 100 and the component mounting apparatus 10 do not need to exchange information for the compensation of the deviation amount, and the tape feeder 100 can be applied to various component mounting apparatuses.

Figure 12:
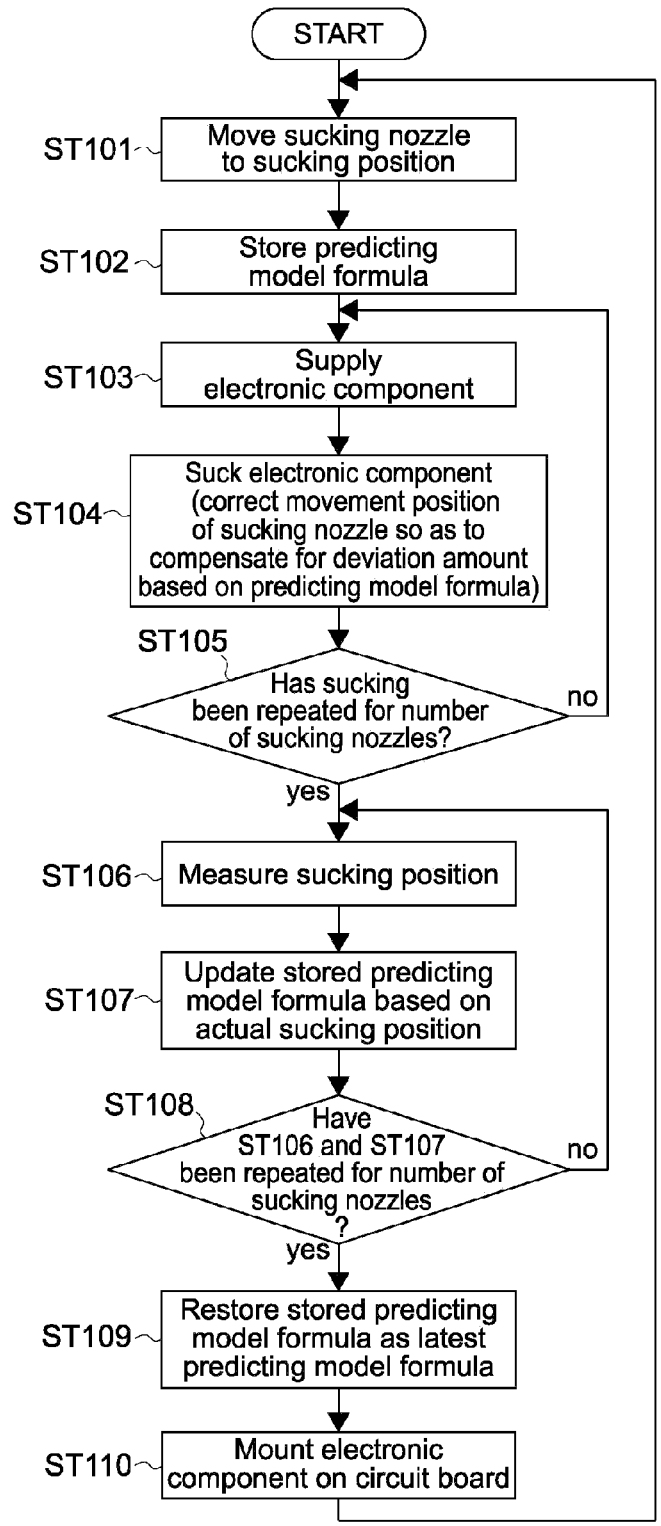
FIG. 12 is a flowchart showing an operation of the tape feeder and the component mounting apparatus according to this embodiment.

FIG. 12 is a flowchart showing an operation of the tape feeder 100 and the component mounting apparatus 10 described above. It should be noted that in the flowchart, the control shown in FIG. 10 is adopted.

The sucking nozzle 18 moves to the sucking position of the component supplying port 125 (Step 101). The tape feeder 100 stores a predicting model formula of Equation (15) in a ROM (Step 102). At a time point at which the predicting model formula is stored for the first time, Y(n)−Ŷ(n:n−1) is 0. The order of Steps 101 and 102 may be opposite.

When an electronic component is supplied to the component supplying port 125 by the tape feeder 100 (Step 103), the sucking nozzle 18 sucks and holds the supplied electronic component (Step 104). Though descriptions will also be given later, ideally, a tip end of the sucking nozzle 18 is positioned at a predetermined reference position of the electronic component such as a center of the electronic component to suck the electronic component. However, in a case where a feed amount of the sprocket 106 by the tape feeder 100 is deviated due to an eccentricity of the gear group, the electronic component is sucked while the tip end of the sucking nozzle 18 is deviated from the reference position in the longitudinal direction of the carrier tape 1. In Step 104, the tape feeder 100 predicts a deviation amount based on the stored predicting model formula and transmits information on the deviation amount to the control system 145. The mounting mechanism 50 corrects a movement position of the sucking nozzle 18 so as to compensate for the deviation amount and sucks the electronic component. Since an actual measurement value Y(n) is obtained when it is currently a time point of a sucking operation of a second round or after, the deviation amount is compensated by the predicting model formula.

In this embodiment, since 12 sucking nozzles 18 are attached to a single tool head 17, the mounting mechanism 50 confirms whether all the sucking nozzles 18 have sucked the electronic components (Step 105).

It should be noted that while all 12 sucking nozzles 18 suck the electronic components as described above, the sprocket 106 practically rotates an angle of [360°*(12/90)]. "90" is the number of teeth of the sprocket 106 in one rotation as described above.

When at least one of the 12 sucking nozzles 18 has not sucked an electronic component, the process returns to Step 103. When all the 12 sucking nozzles 18 have sucked the electronic components, a sucking state, that is, a sucking position of one sucking nozzle 18 is measured by photographing with a camera and image processing by the control system 145. As described above, ideally, the tip end of the sucking nozzle 18 is positioned at a predetermined reference position of an electronic component such as a center of an electronic component to suck the electronic component. However, in a case where a feed amount of the sprocket 106 by the tape feeder 100 is deviated due to an eccentricity of the gear group, the electronic component is sucked while the tip end of the sucking nozzle 18 is deviated from the reference position in the longitudinal direction of the carrier tape 1. Such a state of the sucking position (Y(m), Y(m+1), . . . , Y(m+12) (m is an integer)) is measured by the camera and the control system 145 (Step 106).

After the sucking state of one sucking nozzle 18 is measured, the controller 135 updates the stored predicting model formula based on the actual sucking position (Y(m), Y(m+1), . . . , Y(m+12)) (Step 107). As described above, in a state where feedback cannot be made by consecutive suctions of 12 electronic components, the predicting model formula is updated by carrying out a repetitive calculation with the feedback gain K set to 0 in FIGS. 10 and 11.

Then, the calculation is carried out again at a time point at which an actual sucking position (Y(m), Y(m+1), . . . , Y(m+12)) is identified by the image processing, with the result that a state variable is settled (yes in Step 108, and Step 109). Specifically, after Steps 106 and 107 are completed for all the 12 sucking nozzles 18, the predicting model formula stored up to this time point is restored as a latest predicting model formula (Step 109). The restored predicting model formula is used as a predicting model formula of Steps 102 and 105 in the next round.

After that, in Step 110, the sucking nozzles 18 that have sucked the electronic components at the sucking positions corrected in Step 104 move to the circuit board 19 and successively mount 12 electronic components on the circuit board 19.

Figure 13:
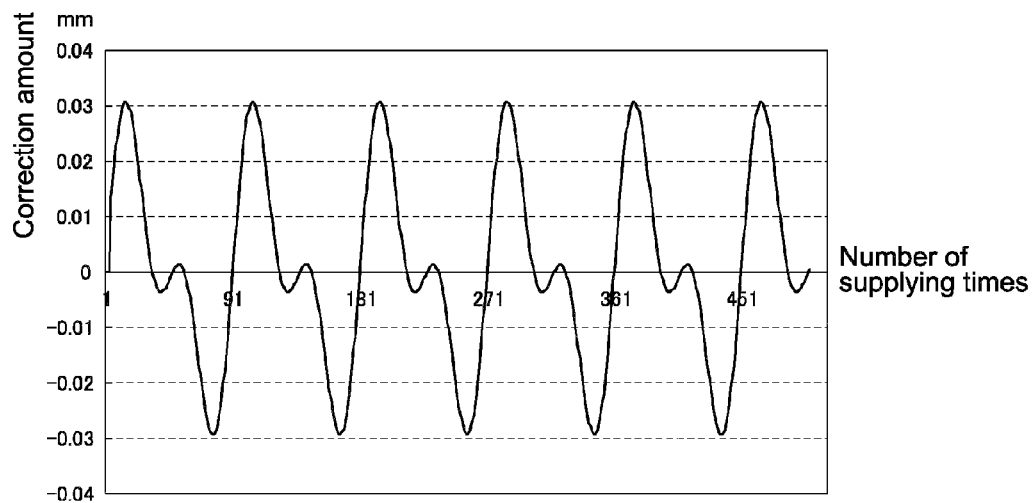
FIG. 13 is a graph showing correction amounts in a case where a correcting method that uses a predicting model formula of this embodiment is applied to a change of the deviation amounts as that shown in FIG. 9.
Figure 14:
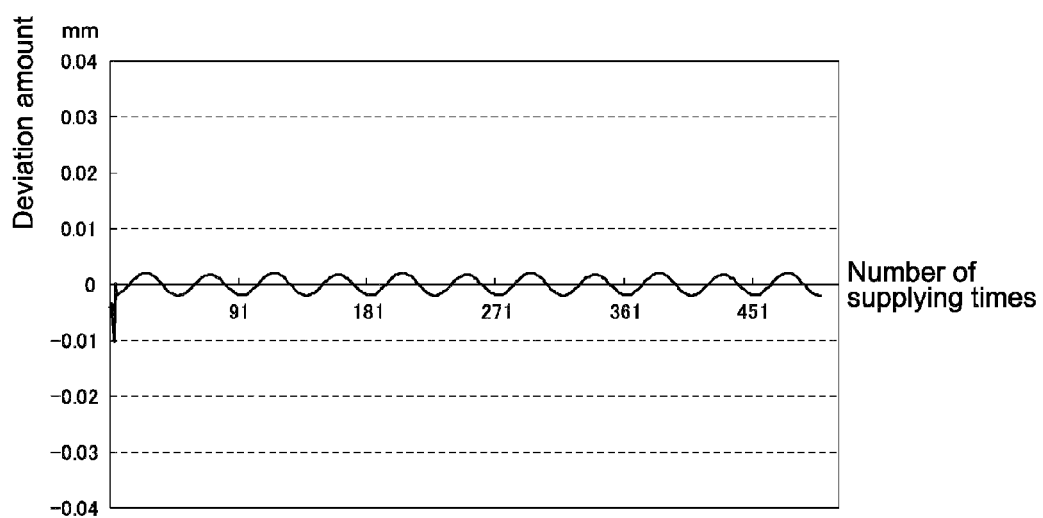
FIG. 14 is a graph showing deviation amounts of sucking positions in a case where the sucking positions are corrected with the correction amounts above.

FIG. 13 is a graph showing correction amounts in a case where a correcting method that uses the predicting model formula of this embodiment is applied to a change of the deviation amounts as that shown in FIG. 9, for example. The abscissa axis represents the number of supplying times, and the ordinate axis represents the correction amount. FIG. 14 is a graph showing deviation amounts of the sucking positions (consequently become deviation amounts of supplying positions) in a case where the sucking positions are corrected with the correction amounts above. As shown in FIG. 14, the deviation amounts can be set to be ±0.01 mm or less, more specifically, about ±0.004 mm.

Figure 15:
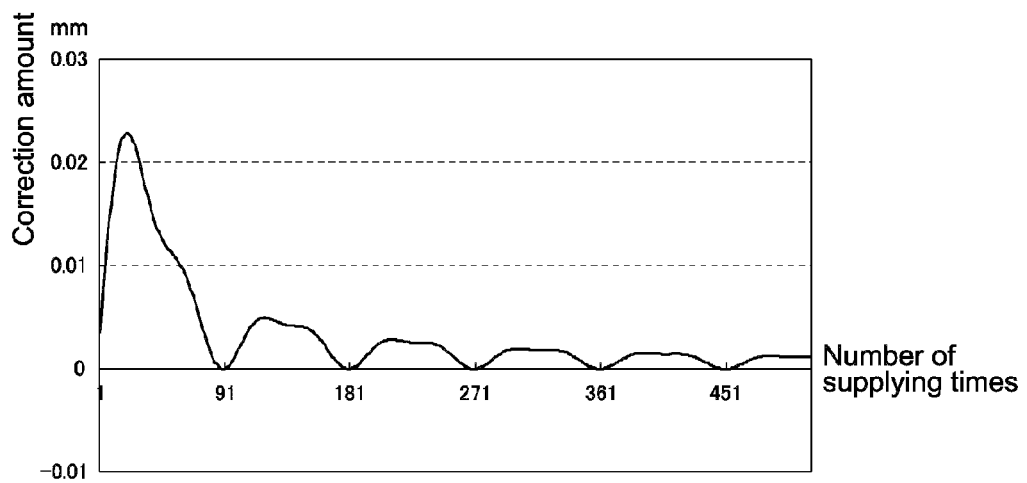
FIG. 15 is a graph showing correction amounts in a case where a correction of a sucking position by a method disclosed in Japanese Patent No. 2917826 (hereinafter, referred to as Patent Document 1) is applied to the change of the deviation amounts as that shown in FIG. 9.
Figure 16:
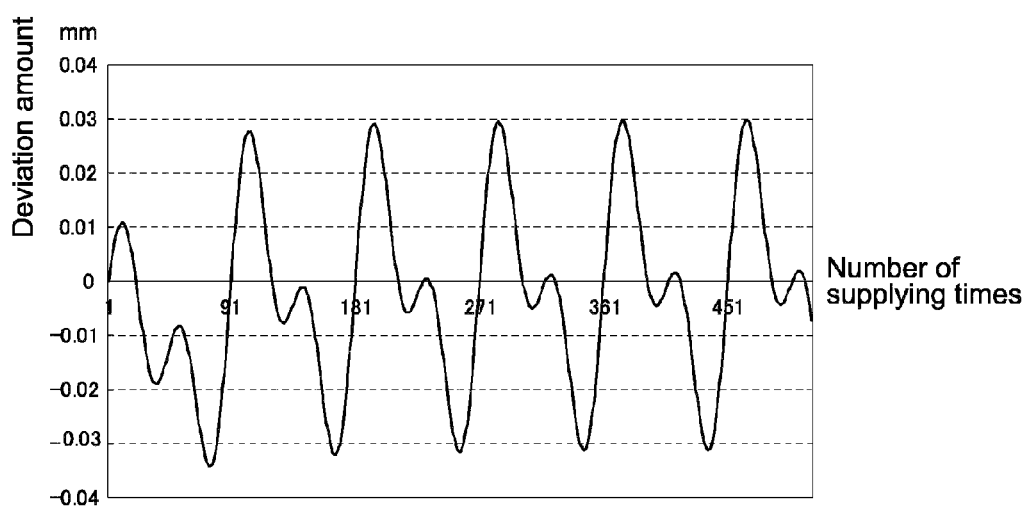
FIG. 16 is a graph showing deviation amounts of sucking positions in a case where the sucking positions are corrected with the correction amounts above.

FIG. 15 is a graph showing correction amounts in a case where a method disclosed in Japanese Patent No. 2917826 (hereinafter, referred to as Patent Document 1) in which the sucking position is corrected using a moving average is applied to the change of the deviation amounts as that shown in FIG. 9, for example. FIG. 16 is a graph showing deviation amounts of the sucking positions in a case where the sucking positions are corrected with the correction amounts above.

As shown in FIGS. 15 and 16, when an average time is long, the sucking positions converge at a mean value of the supplying positions, and a change amount of the supplying positions based on an accuracy of the transmitting mechanism 140 cannot be absorbed by the correction. This is because, since the correction amount approaches zero with time when the mean value of the deviation amounts of the component supplying positions that correspond to the eccentric amounts of the gears is used as the correction amount, the deviation amounts cannot be corrected.

Figure 17:
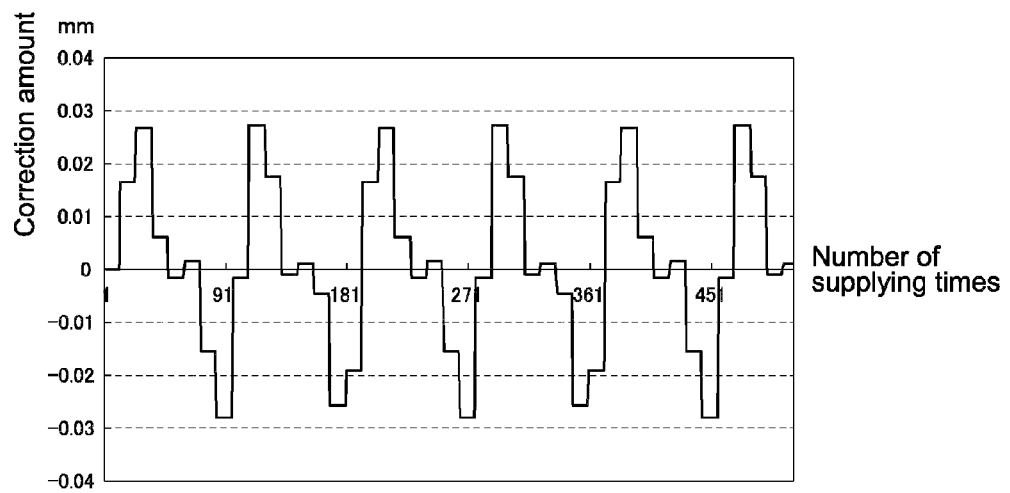
FIG. 17 is a graph showing correction amounts in a case where a component mounting apparatus including 12 sucking nozzles uses the sucking position correcting method of Patent Document 1 with respect to the change of the deviation amounts as that shown in FIG. 9.
Figure 18:
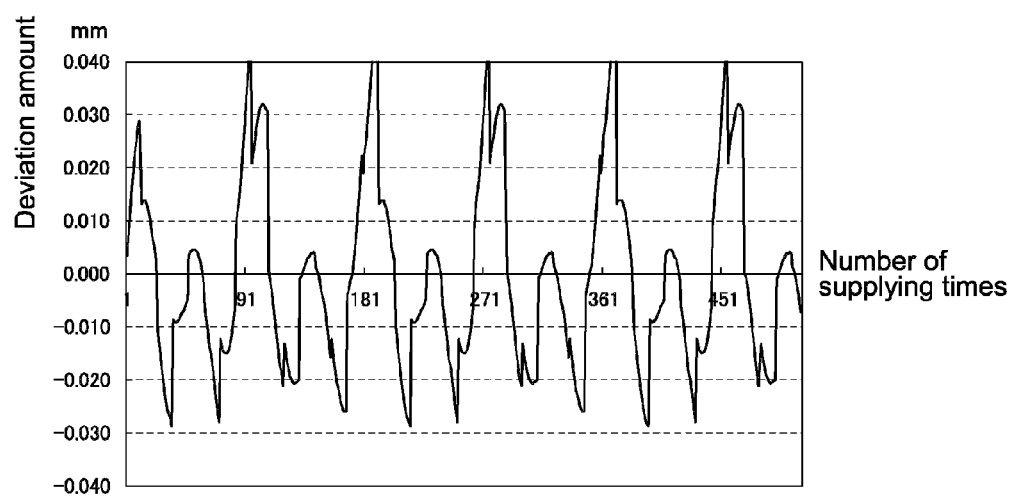
FIG. 18 is a graph showing deviation amounts of the sucking positions in a case where the sucking positions are corrected with the correction amounts above.

FIG. 17 is a graph showing correction amounts in a case where a component mounting apparatus including 12 sucking nozzles uses the sucking position correcting method of Patent Document 1, that uses a moving average, with respect to the change of the deviation amounts as that shown in FIG. 9, for example. FIG. 18 is a graph showing deviation amounts of the sucking positions in a case where the sucking positions are corrected with the correction amounts above. As shown in FIGS. 17 and 18, if a time delay from obtaining a mean value to correcting the sucking position is large, a direction of the fluctuation of the deviation amounts due to the influence of the transmitting mechanism 140 and a direction of the correction amounts become opposite, with the result that the deviation amounts are rather worsened by the correction.

(Second Method)

A second method of predicting a fluctuation of supplying positions to be described below is open-loop control. Specifically, the second method is a method of explicitly obtaining $a_1, a_2, \alpha_1,$ and $\alpha_2$ above and making a prediction instead of the feedback control as shown in FIGS. 10 and 11.

$a_1$ and $a_2$ are obtained by subjecting past data to a Fourier transform as shown in FIG. 9 and obtaining peak values matching the periods of $T_1$ and $T_2$. In the case of the example shown in FIG. 9, $T_1, T_2, a_1,$ and $a_2$ are 90, 45, 0.016, and 0.012, respectively. $T_1$ and $T_2$ are design values of the transmitting gear 137 and the spur gear 107, respectively. Since $a_1$ and $a_2$ are eccentric amounts and processing errors of the transmitting gear 137 and the spur gear 107, respectively, there are individual differences among the gears. In the example shown in FIG. 9, 512 samples are converted into a frequency range by the FFT. Thus, $a_1=4*2/512=0.016$ (mm) and $a_2=3*2/512=0.012$ (mm) are established. At this time, an estimate value $\hat{y}$ is expressed by Equation (16) below.

[Expression 11]

$$\hat{y} = a_1\sin\left(\frac{2\pi}{T_1}t + \alpha_1\right) + a_2\sin\left(\frac{2\pi}{T_2}t + \alpha_2\right) \quad (16)$$

As in Equation (17), while changing $a_1$ and $a_2$ within the range of 0 to $2\pi$, $a_1$ and $a_2$ with which an error between the estimate value and the actual measurement value becomes minimum are determined. In this case, a least-square method only needs to be used.

[Expression 12]

$$e = \tau(y-\hat{y})^2 \quad (17)$$

Figure 19:
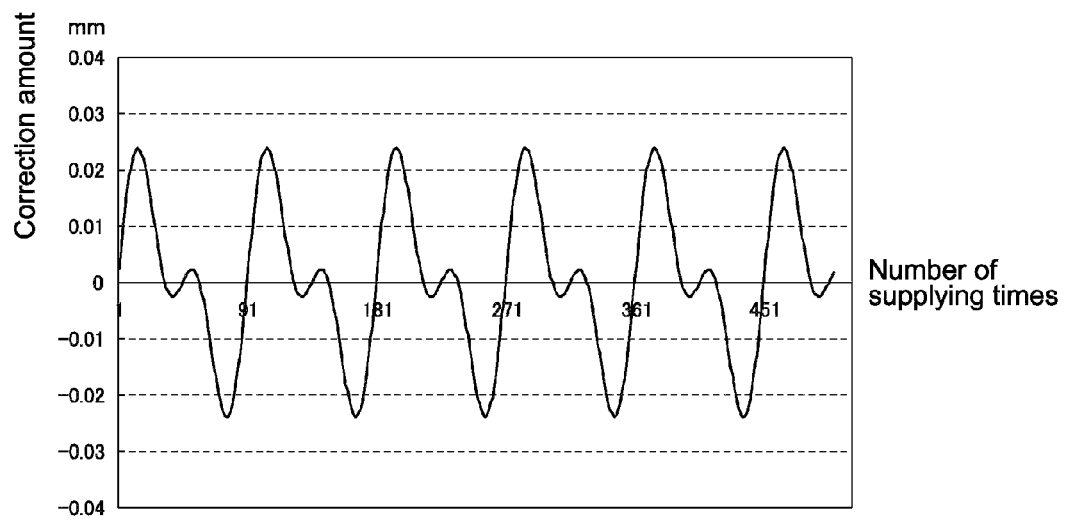
FIG. 19 is a graph showing correction amounts in a case where a constant of a function is obtained by open-loop control in this embodiment.
Figure 20:
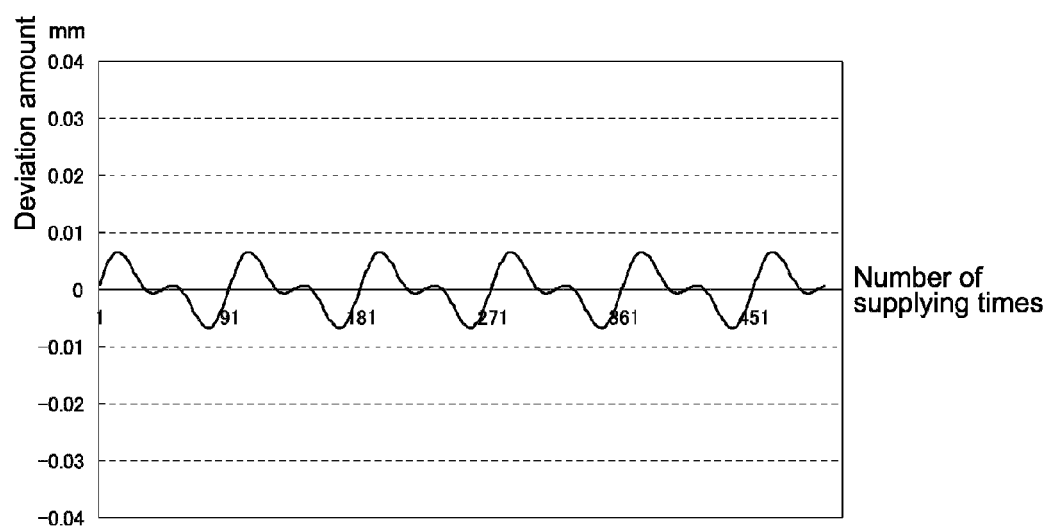
FIG. 20 is a graph showing deviation amounts of the supplying positions in a case where a correction is carried out with the correction amounts above.

In the example of FIG. 9, $a_1$ and $a_2$ become 0.000 and 0.011, respectively. A graph of correction amounts in a case where those values are used is shown in FIG. 19, and deviation amounts of supplying positions when corrected with the correction amounts above are shown in the graph of FIG. 20. Comparing with FIG. 18, it can be seen that the deviation amounts of the sucking positions can be reduced to ⅕.

Heretofore, the predicting model formula for predicting the deviation amounts of the supplying positions due to the eccentricity of the gears and the method of estimating the internal variable of the predicting model formula have been described. Though the internal variable can be estimated in a relatively short time in the first method, an influence of noises such as a measurement error may appear due to the use of a differential.

The second method involves estimating an internal state by an analysis after obtaining some large bodies of data. Therefore, the second method has characteristics that, although calculation costs are required at the time of the estimation, once the calculation is carried out, the internal state ($a_1$, $a_2$, $\alpha_1$, or $\alpha_2$) does not need to be updated from then on, and by not changing the internal state, the estimate value does not become unstable. Either one of the methods may be used, or the methods may be combined such that the first method is used first and at a time point at which large bodies of data are obtained, the controller 135 calculates $a_1$, $a_2$, $\alpha_1$, and $\alpha_2$ and the first method is switched to the second method.

Alternatively, it is also possible for manufacturing operators to collect, at a time of producing the tape feeder 100, data of supplying positions while causing the motor 131 to rotate and causing the tape feeder 100 to learn the predicting model formula in advance before selling the tape feeder 100.

In a case where an image processing error occurs due to, for example, a failure in sucking an electronic component and data of the sucking position therefore cannot be obtained, a predicting model formula is used with the feedback gain K set to 0 at a time of executing the first method. Since the feedback is not performed at the time the second method is executed, the same predicting model formula is used a number of times corresponding to the number of supplying times of the electronic components, irrespective of actual measurement data on the supplying positions.

As described above, the deviation amounts of the supplying positions are predicted based on the predicting model formula expressing a periodical fluctuation of the supplying positions of the electronic components, that is due to the transmitting mechanism 140. Therefore, even when there is a production dimension error in the gears used in the transmitting mechanism 140, by the component mounting apparatus 10 or the tape feeder 100 compensating for the deviation amounts based on information on the deviation amounts, the electronic components can be mounted at accurate positions on the circuit board.

Particularly in the first method, since the tape feeder 100 determines a coefficient of the predicting model formula of the transmitting mechanism 140 by self learning, the method effectively functions on production variations of the transmitting mechanism 140.

Moreover, by the second method, once the coefficient of the predicting model formula is determined, the tape feeder 100 can follow periodical deviations of the supplying positions for compensating for the deviation amounts even in a state where there is no information on a positional deviation from the component mounting apparatus 10.

Further, the predicting model formula of the transmitting mechanism 140 estimated as described above may be stored in a nonvolatile storage device of the tape feeder 100, for example. In this case, even when the tape feeder 100 is disconnected from the component mounting apparatus 10 and power supply is shut off, for example, the tape feeder 100 can resume the operation using stored information on the model formula at a time power is supplied next.

Figure 21:
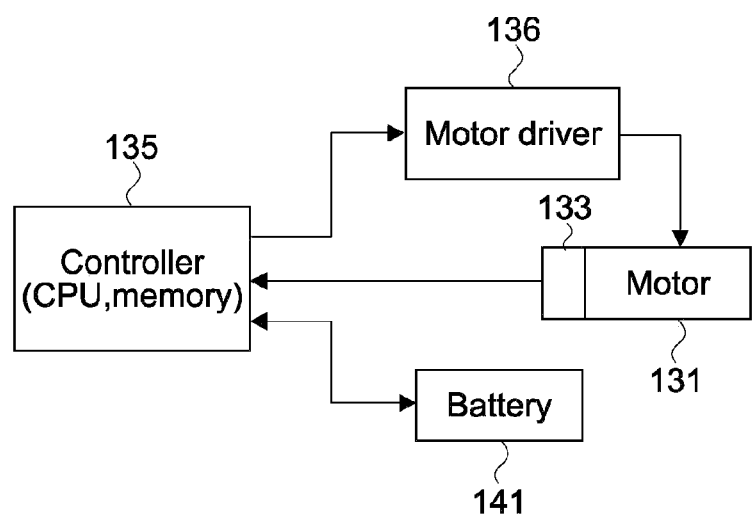
FIG. 21 is a block diagram showing an electrical structure of a tape feeder according to another embodiment of the present invention.

As shown in FIG. 21, the tape feeder 100 may include a battery 141. In this case, at a time the tape feeder 100 is disconnected from the component mounting apparatus 10 and power supply is shut off, for example, the controller 135 only needs to monitor a rotational angle position of the motor 131 by the rotational position detector 133 based on power supply from the battery 141 to the controller 135 and the like. Thus, a correction (update) of the predicting model formula can be carried out automatically at a time the motor 131 rotates. Therefore, it is also possible to resume the supply of electronic components without newly creating a predicting model formula at a time the tape feeder 100 is loaded into the component mounting apparatus 10. In other words, the controller 135 functions as a backup means in this case.

Alternatively, in a case where a mismatch with the predicting model formula occurs due to the battery 141 running out of power, for example, the tape feeder 100 only needs to newly create a predicting model formula at a time the tape feeder 100 is loaded into the component mounting apparatus 10 and the operation is started next. As a result, the tape feeder 100 can constantly supply the electronic components at appropriate supplying positions.

The embodiment of the present invention is not limited to the embodiments described above, and various other embodiments are possible.

The above embodiments have described the example in which a single tool head 17 includes the plurality of sucking nozzles 18 that successively suck and hold electronic components to successively mount them on the circuit board 19. However, an embodiment of the component mounting apparatus in which one sucking nozzle holds one electronic component and mounts the held electronic component on the circuit board 19 may be adopted instead.

The above embodiments have described the controller 135 and the motor driver 136 as elements included in each of the tape feeders 100. However, those components may be elemental functions outside the tape feeder 100 like elemental functions of the component mounting apparatus 10. Alternatively, it is also possible to provide the controller 135 in the component mounting apparatus 10 and provide the motor driver 136 in the tape feeder 100.

The descriptions above have been given on the example in which the present invention is applied to the component mounting apparatus 10 and the tape feeder 100. However, as long as a transmitting mechanism including gears is an apparatus that transmits a driving force of a motor to an object to be driven, any apparatus is applicable as a positioning apparatus.

As in Equations (1) and (2) above, the trigonometric function has been taken as an example of the method of deriving a predicting model formula. However, instead of the trigonometric function, an exponential function, a logarithm function, or a combination or those may be used, for example. A function analogized to the trigonometric function may be created using the exponential function, the logarithm function, or a combination or those.

The present application contains subject matter related to that disclosed in Japanese Priority Patent Application JP 2009-141212 filed in the Japan Patent Office on Jun. 12, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A component supplying apparatus, comprising:
   a motor;
   a rotating body that engages with a carrier tape in which a plurality of components to be mounted on a circuit board by a component mounting apparatus are accommodated at predetermined pitches and gives out the carrier tape at the predetermined pitches for supplying the plurality of components;
   a transmitting mechanism that is coupled to the rotating body and transmits a driving force of the motor to the rotating body; and
   a predicting means for predicting a deviation amount of a supplying position of each of the plurality of components based on a model formula expressing a periodical fluctuation of the supplying position of each of the plurality of components, the periodical fluctuation of the supplying position being due to the transmitting mechanism and caused at a time the carrier tape is given out by the rotating body.

2. The component supplying apparatus according to claim 1, further comprising:
   a correcting means for correcting the supplying position of each of the plurality of components such that the deviation amount predicted by the predicting means is compensated for.

3. The component supplying apparatus according to claim 1, wherein:
   the transmitting mechanism includes a gear group constituted by a plurality of gears, and
   the predicting means predicts the deviation amount using (i) a first formula that expresses, by a first function, a respective periodical fluctuation of the supplying position of each of the plurality of components that is due to each of the plurality of gears and (ii) a second formula that expresses, by a second function obtained by adding each of the first functions, the periodical fluctuation of the supplying position of each of the plurality of components that is overall due to the gear group.

4. The component supplying apparatus according to claim 1, further comprising:
   a storage device to store information of the model formula.

5. The component supplying apparatus according to claim 4, further comprising:
   a battery; and
   a backup means for supplying power from the battery to the component supplying apparatus at a time power supply to the component supplying apparatus is shut off.

* * * * *